(12) United States Patent
Lee

(10) Patent No.: US 6,548,870 B1
(45) Date of Patent: Apr. 15, 2003

(54) SEMICONDUCTOR DEVICE

(75) Inventor: Hi Deok Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/723,222

(22) Filed: Nov. 28, 2000

(30) Foreign Application Priority Data

May 1, 2000 (KR) ........................................ 2000-23275

(51) Int. Cl.[7] .............................................. H01L 29/76
(52) U.S. Cl. ........................ 257/365; 257/296; 257/318; 257/319; 257/331; 257/343; 257/366
(58) Field of Search ................................ 257/366, 365, 257/296, 318, 319, 331, 343

(56) References Cited

U.S. PATENT DOCUMENTS

| | | | | |
|---|---|---|---|---|
| 4,380,863 A | * | 4/1983 | Rao | 29/571 |
| 4,472,821 A | * | 9/1984 | Mazin et al. | 377/79 |
| 5,047,816 A | * | 9/1991 | Cuevas | 357/23.14 |
| 5,600,168 A | * | 2/1997 | Lee | 257/336 |
| 5,616,945 A | * | 4/1997 | Williams | 257/365 |
| 5,949,103 A | | 9/1999 | Lee | |
| 6,259,142 B1 | * | 7/2001 | Dawson et al. | 257/318 |

* cited by examiner

Primary Examiner—Richard Elms
Assistant Examiner—Douglas Menz
(74) Attorney, Agent, or Firm—Birch, Stewart, Kolasch & Birch, LLP

(57) ABSTRACT

In the semiconductor device, a first impurity region and a second impurity region are formed in a surface of a semiconductor substrate at a regular interval, and a gate insulating layer is formed on the semiconductor substrate between the first impurity region and the second impurity region. At least two gate electrodes are formed on the gate insulating layer, and are insulated from one another by an intergate insulation layer.

12 Claims, 3 Drawing Sheets

SEMICONDUCTOR DEVICE

BACKGROUND HE INVENTION

1. Field of the Invention

The present invention relates to a semiconductor device, and more particularly to a semiconductor device structure which is suitable for an integrated circuit of high performance.

2. Background of the Related Art

Currently, in order to realize high performance and high integration of a semiconductor integrated circuit, technologies for enabling high speed operation of a device and for minimizing a chip size have been suggested.

For example, methods for reducing an area occupied by source and drain impurity regions or a length of a channel are under study. According to one method, when two identical elements, such as NMOS transistors of a NAND circuit, or PMOS transistors of a NOR circuit, are serially connected, the two elements use one impurity region in common, thereby reducing an entire impurity region.

FIG. 1A is general NAND circuit diagram, wherein 'A' shows a structure in which two NMOS transistors are serially connected. FIG. 1B is a general NOR circuit diagram, wherein 'B' shows a structure in which two PMOS transistors are serially connected.

FIG. 1C shows a structure of a path transistor in which NMOS transistors are serially connected. It should be understood that PMOS transistors could be similarly connected.

A structure of a related art semiconductor device will be described with reference to the accompanying drawings.

FIG. 2 is a sectional view of a related art semiconductor device and shows 'A' of FIG. 1A.

Referring to FIG. 2, the related art semiconductor device includes a semiconductor substrate 21, first and second gate electrodes 23 and 24 formed on the semiconductor substrate 21 at a regular interval, insulating sidewalls 25 formed at both sides of each of the first and second gate electrodes 23 and 24, a common impurity region 26 having an LDD (lightly doped drain) structure formed in the substrate between the first gate electrode 23 and second gate electrode 24, and first and second impurity regions 27 and 28 each having an LDD structure formed at one side of each of the gate electrodes 23 and 24 to oppose the common impurity region 26.

The gate electrodes 23 and 24 have a gate insulating layer 29 formed between each of the gate electrodes 23 and 24 and the semiconductor substrate 21.

The first impurity region 27 is used as a source (or drain) region, the second impurity region 28 is used as a drain (or source) region, and the common impurity region 26 is used as drain/source regions.

In the aforementioned semiconductor device, if a high voltage signal is applied to the first and second gate electrodes 23 and 24, a signal charge is transmitted from the first impurity region 27 to the common impurity region 26, and then to the second impurity region 28.

When the semiconductor device shown in FIG. 2 corresponds to 'B' of the NOR circuit shown in FIG. 1B, if a low voltage signal is applied to the first and second gate electrodes 23 and 24, a signal charge is transmitted from the first impurity region 27 to the common impurity region 26, an then to the second impurity region 28.

However, the related art semiconductor device has the following problems.

The size of the semiconductor device is increased by the common impurity region existing between the two gate electrodes, and a voltage drop is caused by resistance of source, drain and LDD regions, thereby reducing a driving current and lowering the operating speed.

SUMMARY OF THE INVENTION

Accordingly, an object of the present invention is to solve at least the problems and disadvantages of the related art.

Another object of the present invention is to provide a semiconductor device in which an impurity region between two gates is eliminated to minimize a size of the device and to shorten a length of a channel, thereby improving an operating speed of the device.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, a semiconductor device having two or more PMOS or NMOS transistors serially connected to each other includes a first impurity region and a second impurity region formed in a surface of a semiconductor substrate at a regular interval; a gate insulating layer formed on the semiconductor substrate between the first impurity region and the second impurity region; and two or more gate electrodes formed on the gate insulating layer to be insulated from each other.

BRIEF DESCRIPTION OF THE DRAWINGS

The invention will be described in detail with reference to the following drawings in which like reference numerals refer to like elements wherein.

DESCRIPTION OF THE PREFERRED EMBODIMENT

Reference will now be made in detail to the preferred embodiments of the present invention, examples of which are illustrated in the accompanying drawings.

When a semiconductor device of the present invention is composed of NMOS transistors, the device could be used for a NAND circuit, and when a semiconductor device of the present invention is composed of PMOS transistors, the device could be used for a NOR circuit.

In addition, a structure in which NMOS or PMOS transistors are serially connected to each other can be used for a path transistor that performs switching function.

Referring to the accompanying drawings, a structure of a semiconductor device according to the present invention will be described.

Figure 1A:
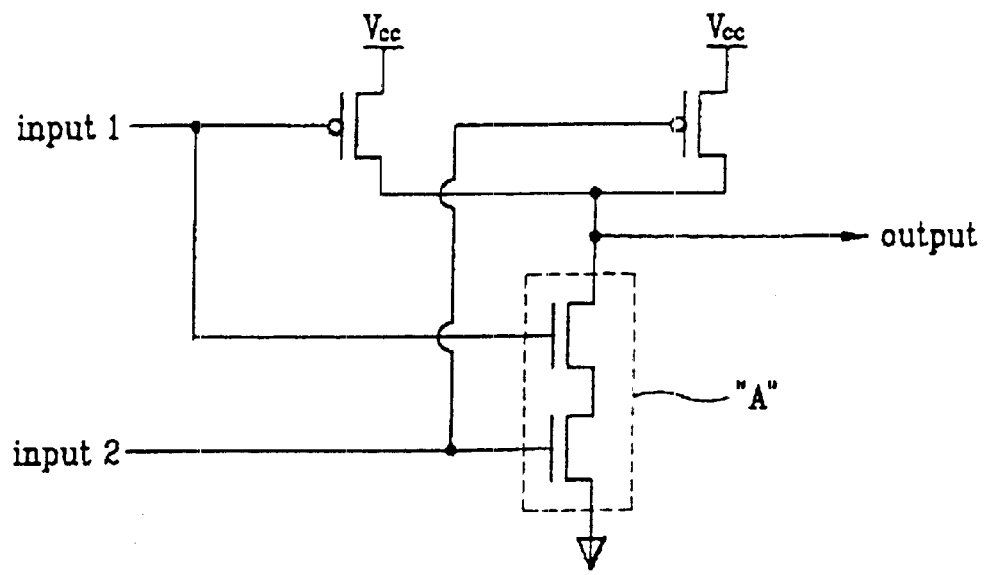
FIG. 1A is a general NAND circuit diagram.
Figure 1B:
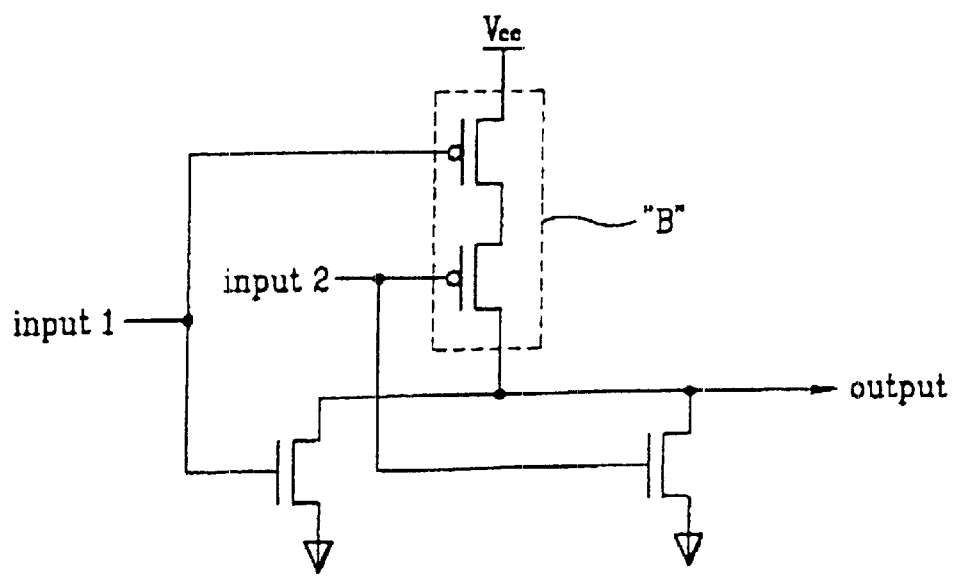
FIG. 1B is a general NOR circuit diagram.
Figure 1C:
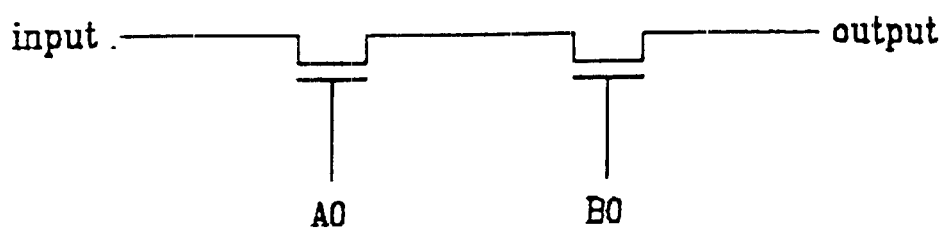
FIG. 1C shows the serial connection at two NMOS transistors forming a path transistor.
Figure 2:
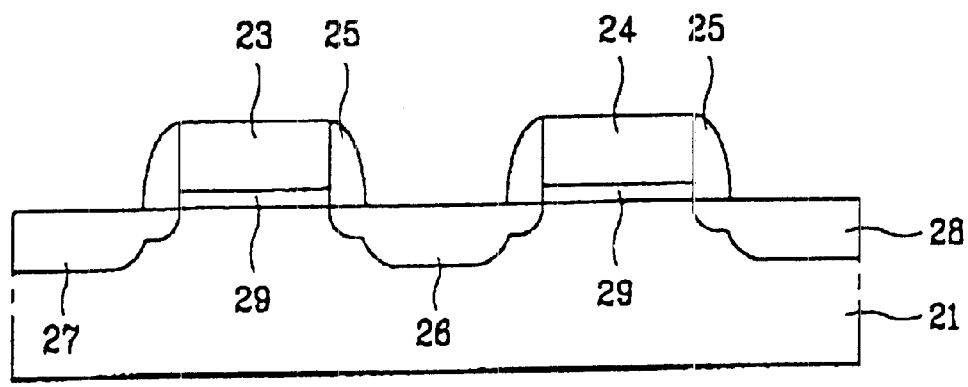
FIG. 2 is a sectional view showing a structure of a related art semiconductor device.
Figure 3:
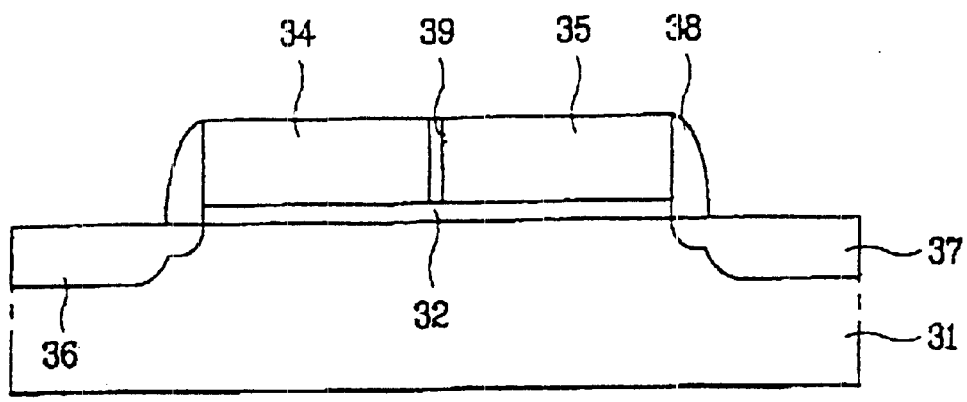
FIG. 3 is a sectional view showing a structure of a semiconductor device in accordance with a first preferred embodiment of the present invention.

FIG. 3 is a sectional view showing a structure of a semiconductor device in accordance with a first preferred embodiment of the present invention.

The semiconductor device includes a semiconductor substrate 31, a gate insulating layer 32 formed at a predetermined area on the semiconductor substrate 31, a first gate electrode 34 and a second gate electrode 35 formed on the gate insulating layer 32 and insulated from each other by an insulation layer 39, a first impurity region 36 and a second impurity region 37 formed in the semiconductor substrate at both sides of the first and second gate electrodes 34 and 35 except a channel region under the first and second gate electrodes 34 and 35, and insulating sidewalls 38 formed at a side of the first gate electrode 34 in contact with the first impurity region 36 and at a side of the second gate electrode 35 in contact with the second impurity region 37.

The first impurity region 36 is used as a source (or drain) region and the second impurity region 37 is used as a drain (or source) region.

In the above-structured semiconductor device, two elements have one source region and one drain region.

That is, while the related art semiconductor device having two elements serially connected to each other includes one source region, one drain region and one common impurity region-commonly used as a source/drain region the semiconductor device of the present invention does not include a common impurity region, thereby minimizing a size of the device.

Also, according to the present invention, an insulating layer 39 is formed between the first gate electrode 34 and the second electrode 35 to insulate the first gate electrode 34 and the second electrode 35 from each other. The insulating layer 39 has a minimum width for insulating the first gate electrode 34 from the second gate electrode 35.

If the semiconductor device of the present invention is composed of NMOS transistors, the first and second impurity regions 36 and 37 are n-type impurity regions, and a channel between the first impurity region 36 and the second impurity region 37 is formed only when a high voltage signal is applied to both of the gate electrodes, so that a signal charge is transmitted from the first impurity region 36 to the second impurity region 37. However, when a low voltage signal is applied to any one of the gate electrodes, a channel is not formed between the first impurity region 36 and the second impurity region 37.

Because the method of forming the semiconductor device of FIG. 3 is readily apparent from the above structural description of FIG. 3, and involves the use of well-known processing techniques, the method of forming the semiconductor device of FIG. 3 will not be described for the sake of brevity.

If the semiconductor device of the present invention is composed of PMOS transistors, the first and second impurity regions 36 and 37 are p-type impurity regions, and a channel between the first impurity region 36 and the second impurity region 37 is formed only when a low voltage signal is applied to both of the gate electrodes, so that a signal charge is transmitted from the first impurity region 36 to the second impurity region 37.

Figure 4:
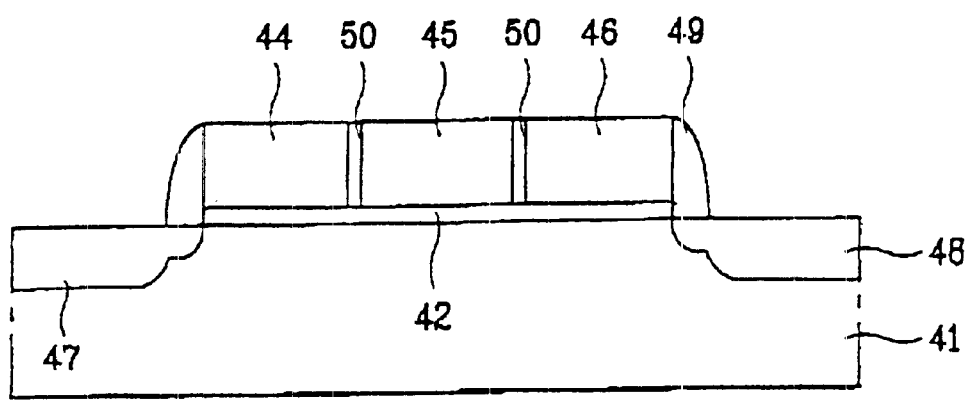
FIG. 4 is a sectional view showing a structure of a semiconductor device in accordance with a second preferred embodiment of the present invention.

FIG. 4 is a sectional view showing a structure of a semiconductor device in accordance with a second preferred embodiment of the present invention.

FIG. 4 shows a structure of a semiconductor device in which three elements are serially connected.

Referring to FIG. 4, three gate electrodes 44, 45, and 46 are formed on a gate insulation layer 42, which is on a semiconductor substrate 41. Also, insulating layers 50 are formed between gate electrodes 44 and 45 and between gate electrodes 45 and 46 to insulate the gate electrodes from each other. Insulating sidewalls 49 are formed at sides of the outermost gate electrodes 44 and 46, and a source impurity region (or drain impurity region) 47 having an LDD structure and a drain impurity region (or source impurity region) 48 having an LDD structure are formed in the semiconductor substrate at sides of the insulating sidewalls 49.

The center gate electrode 45 does not have source and drain regions associated therewith, and the two outermost gate electrodes 44 and 46 have one source or one drain.

Because the method of forming the semiconductor device of FIG. 4 is readily apparent from the above structural description of FIG. 4, and involves the use of well-known processing techniques, the method of forming the semiconductor device of FIG. 4 will not be described for the sake of brevity.

As described above, the semiconductor device according to the present invention has the following, advantages.

The size of the semiconductor device can be reduced to minimize the chip size, thereby satisfying high integration. Also, since a common impurity region for use as a source/drain region is not formed, resistance can be reduced to enable high speed operation of the device.

The foregoing embodiments are merely exemplary and are not to be construed as limiting the present invention. The present teachings can be readily applied to either types of apparatuses. The description of the present invention is intended to be illustrative, and not to limit the scope of the claims. Many alternatives, modifications, and variations will be apparent to those skilled in the art.

What is claimed:

1. A semiconductor device, comprising:
   a first impurity region and a second impurity region formed in a surface of a semiconductor substrate at a regular interval;
   a gate insulating layer formed on the semiconductor substrate between the first impurity region and the second impurity region said gate insulating layer having a uniform thickness; and
   a plurality of adjacent gate electrodes formed on said gate insulating layer, said plurality of gate electrodes having identical size and shape.

2. The semiconductor device as claimed in claim 1, wherein the semiconductor device is a NAND circuit and the first and second impurity regions are n-type impurity regions.

3. The semiconductor device as claimed in claim 1, wherein the semiconductor device is a NOR circuit and the first and second impurity regions are p-type impurity regions.

4. The semiconductor device as claimed in claim 1, further comprising:
   an intergate insulation layer formed between the first and second gate electrodes to insulate the first and second gate electrodes from one another.

5. The semiconductor device as claimed in claim 4, wherein the intergate insulating layer has a minimum width for insulating the first end second gate electrodes from each other.

6. The semiconductor device as claimed in claim 1, wherein the first impurity region and the second impurity region are used as a source region and a drain region, respectively, or as a drain region and a source region, respectively.

7. A semiconductor device having two NMOS transistors serially connected to each other, the semiconductor device comprising:
   a first n-type impurity region and a second n-type impurity region formed in a surface of a semiconductor substrate at a regular interval;
   a gate insulating layer formed on the semiconductor substrate between the first n-type impurity region and the second n-type impurity region said gate insulating layer having a uniform thickness; and
   a plurality of adjacent gate electrodes formed on said gate insulating layer, said plurality of gate electrodes having identical size and shape.

8. The semiconductor device as claimed in claim 7, further comprising:
   an intergate insulation layer formed between the first and second gate electrodes to insulate the first and second gate electrodes from one another.

9. The semiconductor device as claimed in claim 7, wherein the first n-type impurity region and the second n-type impurity region are used as a source region and a drain region, respectively, or as a drain region and a source region, respectively.

10. A semiconductor device having two PMOS transistors serially connected to each other, the semiconductor device comprising:
    a first p-type impurity region and a second p-type impurity region formed in a surface of a semiconductor substrate at a regular interval;
    a gate insulating layer formed on the substrate between the first p-type impurity region and the second p-type impurity region said gate insulating layer having a uniform thickness; and
    a plurality of adjacent gate electrodes formed on said gate insulating layer, said plurality of gate electrodes having identical size and shape.

11. The semiconductor device as claimed in claim 10, further comprising:
    an intergate insulation layer formed between the first and second gate electrodes to insulate the first and second gate electrodes from one another.

12. The semiconductor device as claimed in claim 10, wherein the first p-type impurity region and the second p-type impurity region are used as a source region and a drain region, respectively, or as a drain region and a source region, respectively.

* * * * *